United States Patent [19]

Atkinson

[11] 3,896,445

[45] July 22, 1975

[54] ELECTRONIC BANDSWITCHING FOR AUTOMATIC DIRECTION FINDER

[75] Inventor: Lowell G. Atkinson, Indianapolis, Ind.

[73] Assignee: General Aviation Electronics, Inc., Indianapolis, Ind.

[22] Filed: Jan. 2, 1974

[21] Appl. No.: 430,241

[52] U.S. Cl. ................ 343/117; 325/458; 325/462; 325/464; 331/179

[51] Int. Cl. .............................................. G01s 5/02

[58] Field of Search ...... 325/458, 462, 464; 334/14, 334/15; 343/117; 331/179

[56] References Cited

UNITED STATES PATENTS

| | | | |
|---|---|---|---|
| 3,564,548 | 2/1971 | Grillot et al. | 343/17 |
| 3,646,450 | 2/1972 | Ma | 325/458 |
| 3,704,423 | 11/1972 | Kadron et al. | 325/458 |

*Primary Examiner*—Maynard R. Wilbur
*Assistant Examiner*—T. M. Blum
*Attorney, Agent, or Firm*—Woodard, Weikart, Emhardt & Naughton

[57] ABSTRACT

Electronic bandswitching circuitry for an automatic direction finder. Tuned subcircuits are connected in parallel in the RF and local oscillator portions of an automatic direction finder, and inductors and capacitors in the subcircuits are electronically switched into and out of the circuit to tune to the frequency band containing a frequency selected to be received. The capacitors from only one subcircuit at a time are switched into the tuned circuit.

5 Claims, 5 Drawing Figures

ELECTRONIC BANDSWITCHING FOR AUTOMATIC DIRECTION FINDER

BACKGROUND OF THE INVENTION

1. Field of the Invention

The invention is in the field of self-orienting radio wave communications.

2. Description of the Prior Art

Automatic direction finders (ADF) for aircraft have been employed which have a frequency range generally from 200 kilohertz to 1,699 kilohertz, wherein a plurality of frequency bands cover this frequency range. Manual slide switches have been used to select desired frequency bands, but such mechanical switches are complicated and must be located at the receiver board of the ADF.

Electronic bandswitching of an intermediate frequency oscillator in an automatic direction finder is shown in U.S. Pat. No. 3,564,548 to Grillot et al. In the Grillot patent, the method of bandswitching entails the addition of inductances of a tuned circuit in series.

SUMMARY OF THE INVENTION

One embodiment of the present invention comprises an ADF having a plurality of selectable frequency bands which includes tuning means in the RF portion of the ADF for tuning to bands of the plurality of selectable frequency bands, and electronic switching means for electronically switching the tuning means to tune to the frequency band containing a frequency selected to be received.

It is an object of the present invention to provide an automatic direction finder having electronic bandswitching of tuned circuits in its RF circuitry.

It is a further object of the present invention to provide an automatic direction finder having electronic bandswitching in its local oscillator which includes a plurality of switchable parallel tuned circuits.

DESCRIPTION OF THE PREFERRED EMBODIMENT

Figure 1:
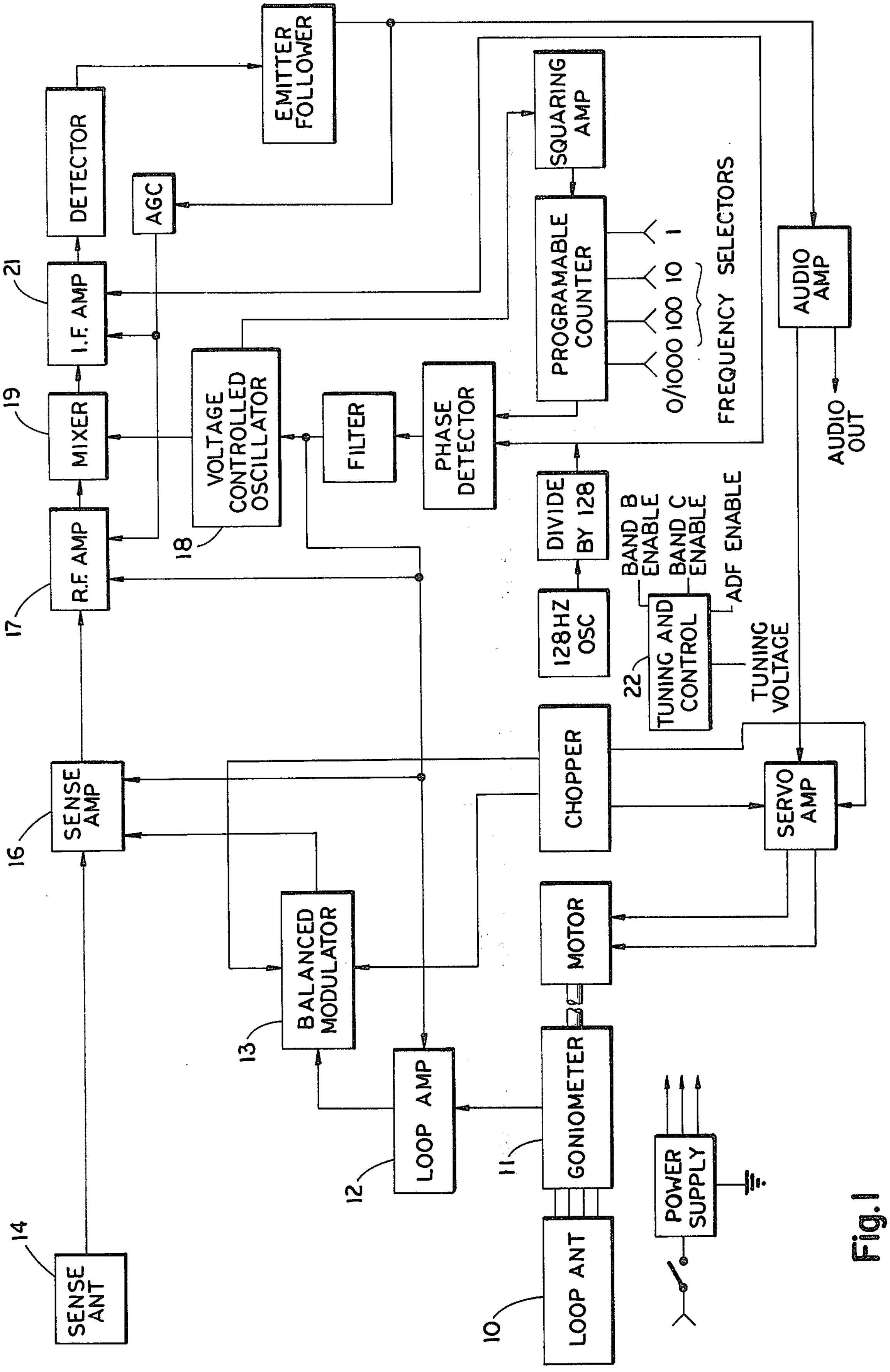
FIG. 1 is a block diagram of an automatic direction finder which includes electronic bandswitching according to the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring in particular to FIG. 1, there is shown a block diagram of an automatic direction finder (ADF) which embodies the present invention. The loop signal received by goniometer 11 from loop antenna 10 is combined with the sense signal from sense antenna 14 to yield a cardioid response characteristic, which provides the basis for the direction sensing and indicating portions of the ADF. According to the present invention, electronic bandswitching is provided in the receiver and synthesizer circuitry, more particularly in the loop amplifier 12, sense amplifier 16, radio frequency amplifier 17 and voltage controlled oscillator 18.

As shown in FIG. 1, a tuning and control portion 22 is provided, enabling the operator of the ADF to switch to a receive-only mode or an ADF mode and for tuning to a desired frequency. Among the signals and control voltages controlled by the tuning and control head 22 are the Band B- and Band C- enable voltages, an ADF-enable signal, and a variable tuning voltage. These signals from the control head are applied to the various bandswitching and tuning circuits described in detail hereinafter. The proper Band-enable signals are established as the operator of the ADF selects a desired frequency to be received by rotating frequency selector knobs. The enabling signals and electronic bandswitching permit remote control of the tuning operation without mechanical switches.

Figure 2:
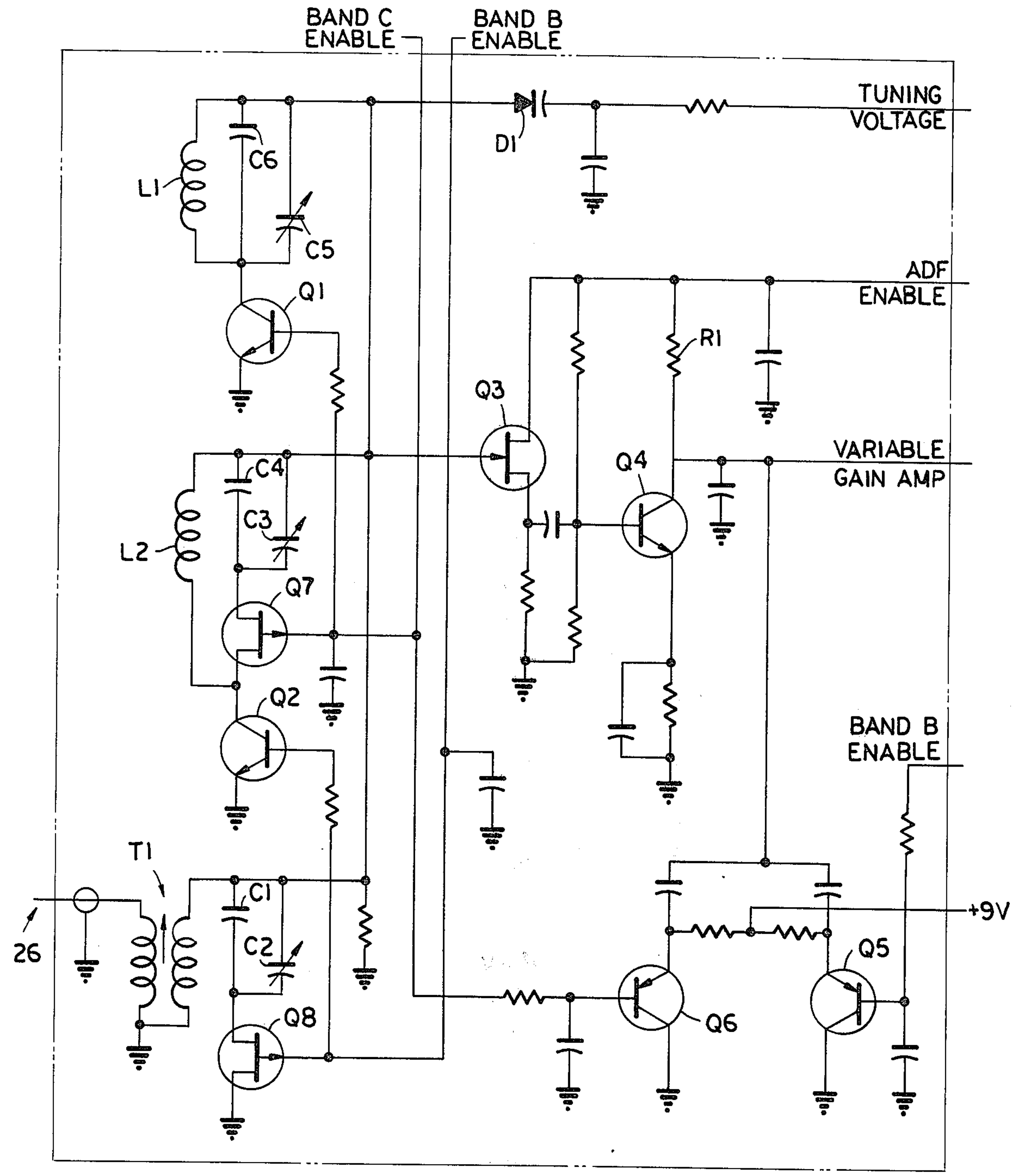
FIG. 2 is a schematic diagram of a portion of the loop amplifier of FIG. 1.

In FIG. 2, there is shown a portion of loop amplifier 12, including electronic bandswitching circuitry according to the present invention. The loop amplifier comprises Q1 through Q8 and their associated circuitry. The input at 26 to the loop amplifier is the output signal from the rotor windings of goniometer 11 (FIG. 1). The loop amplifier input is applied to the primary of T1, the low-band loop amplifier transformer.

Electronic bandswitching is employed throughout the tuned RF circuitry of the loop amplifier, and other portions of the receiver circuitry as shall be outlined below. The RF input is applied across the primary of transformer T1, and the secondary of transformer T1 is paralleled with inductances L1 and L2, which are switched in and out of the circuit. The necessary shunt capacitance is provided in the form of fixed capacitors and a varactor.

In operation, when receiving in the 200 kilohertz to 399 kilohertz range (Band A), the ADF-enable line is at +9 volts and Q8 is turned on, placing C1 and C2 in parallel with the secondary of T1. Varactor diode D1 is used to tune the circuit to the exact frequency desired by varying the tuning voltage input to D1.

When the operator of the ADF rotates the frequency selectors (not shown) to tune a frequency in the 400 kilohertz to 799 kilohertz (Band B) range, the Band B-enable line is switched from ground to +9 volts. This action turns off Q8, removing C1 and C2 from the tuned circuit. The +9 volts applied to the Band B-enable line turns on Q2 and Q7, placing L2, and C3 and C4, respectively, in parallel with T1. This LC circuit is again tuned by the shunt capacitance of varactor diode D1.

When the frequency selectors are rotated to a frequency setting between 800 kilohertz and 1,699 kilohertz (Band C), the Band B-enable line remains at the +9 volt level and the Band C-enable line is placed at +9 volts also. This action will turn off Q7 and turn on Q1, removing C3 and C4 from the tuned circuit and placing L1, C5 and C6 in parallel with L2 and T1. Varactor diode D1 is again used to track-tune the circuit.

As described, the Band B- and C-enable voltages are applied automatically as the ADF receiver is tuned to the various frequency bands as an additional function of the tuning circuitry. The central feature is that the appropriate band enable lines for a desired frequency band are energized to permit tuning within the desired band. In the present embodiment, frequency selector switch contacts couple the Band B-enable line to the +9 volt supply for frequencies above 399 kilohertz and couple the Band C-enable line to the +9 volt supply for frequencies above 799 kilohertz.

The loop signal received from the appropriate tuned circuit is applied to the gate of Q3, the loop amplifier source follower. The source follower output is applied to Q4, the first loop amplifier. The collector load for Q4 consists of R1 and its parallel capacitance. The parallel capacitance is switched as the receiver bands are changed, through the operation of Q5 and Q6. The output from the collector of Q4 is applied to a variable gain amplifier stage (not shown) and a following fixed amplifier stage (not shown). These amplifier stages complete the circuitry of loop amplifier 12 (FIG. 1). The output of the last amplifier stage of loop amplifier 12 is coupled to balanced modulator 13, whose output is one input to sense amplifier 16.

Figure 3:
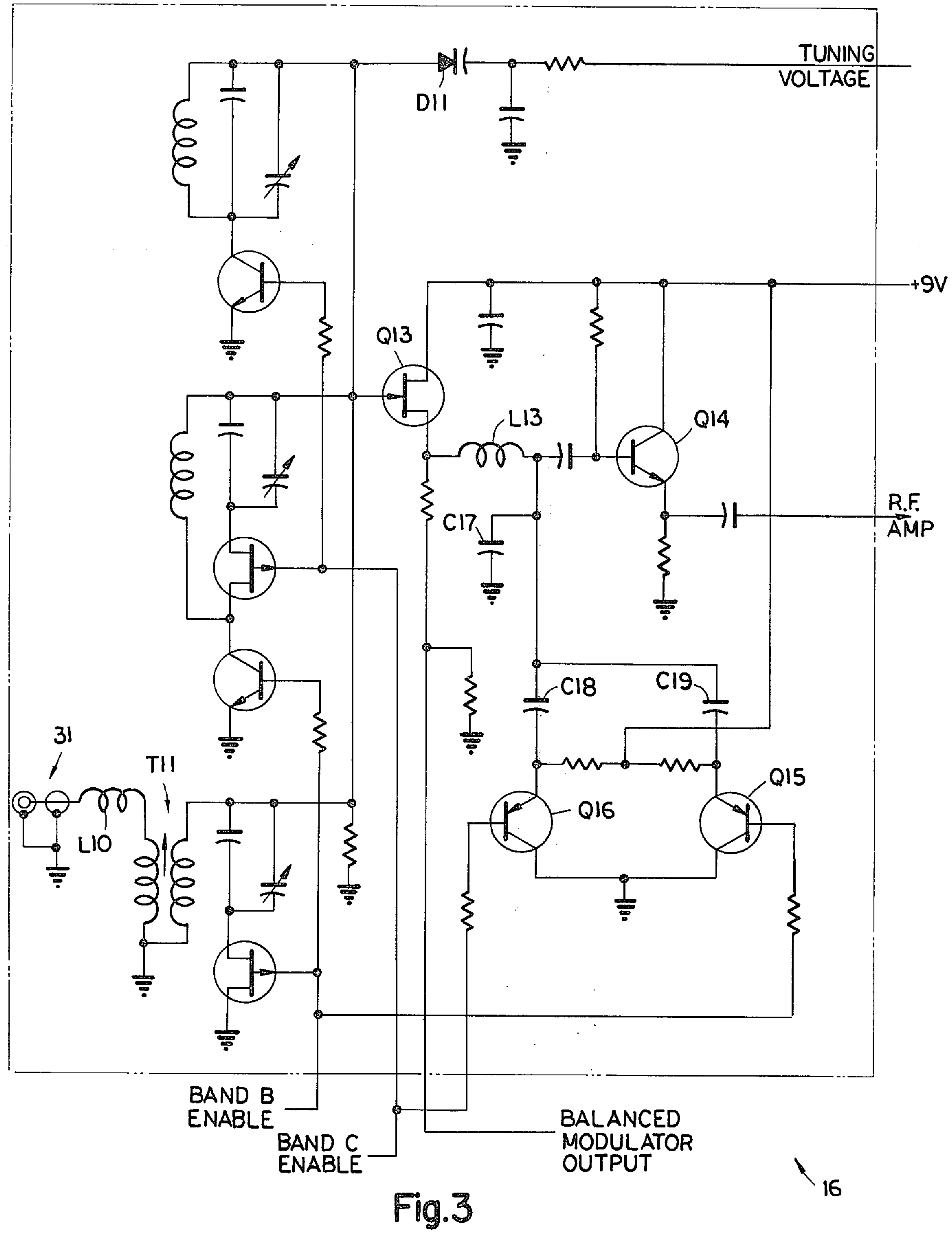
FIG. 3 is a schematic diagram of the sense amplifier of FIG. 1.

In FIG. 3, there is shown the circuitry of sense amplifier 16. The signal from sense antenna input 31 is applied to the primary of transformer T11 through VHF suppression coil L10. The bandswitching method employed in the sense amplifier is identical to the loop amplifier bandswitching. The output of the tuned circuit is varactor tuned by diode D11 and coupled to the gate of the sense source follower Q13. At the source of Q13, the loop signal from the balanced modulator output is added to the sense signal. The signal on the source of the source follower Q13 is applied to an LC bandshaping circuit consisting of L13, C17, and C18 or C19. The appropriate bandswitching capacitance is selected for each band through the action of transistors Q15 and Q16, controlled by the Band B- and C-enable lines. The output of the sense emitter follower Q14 is applied to the RF amplifier 17.

Figure 4:
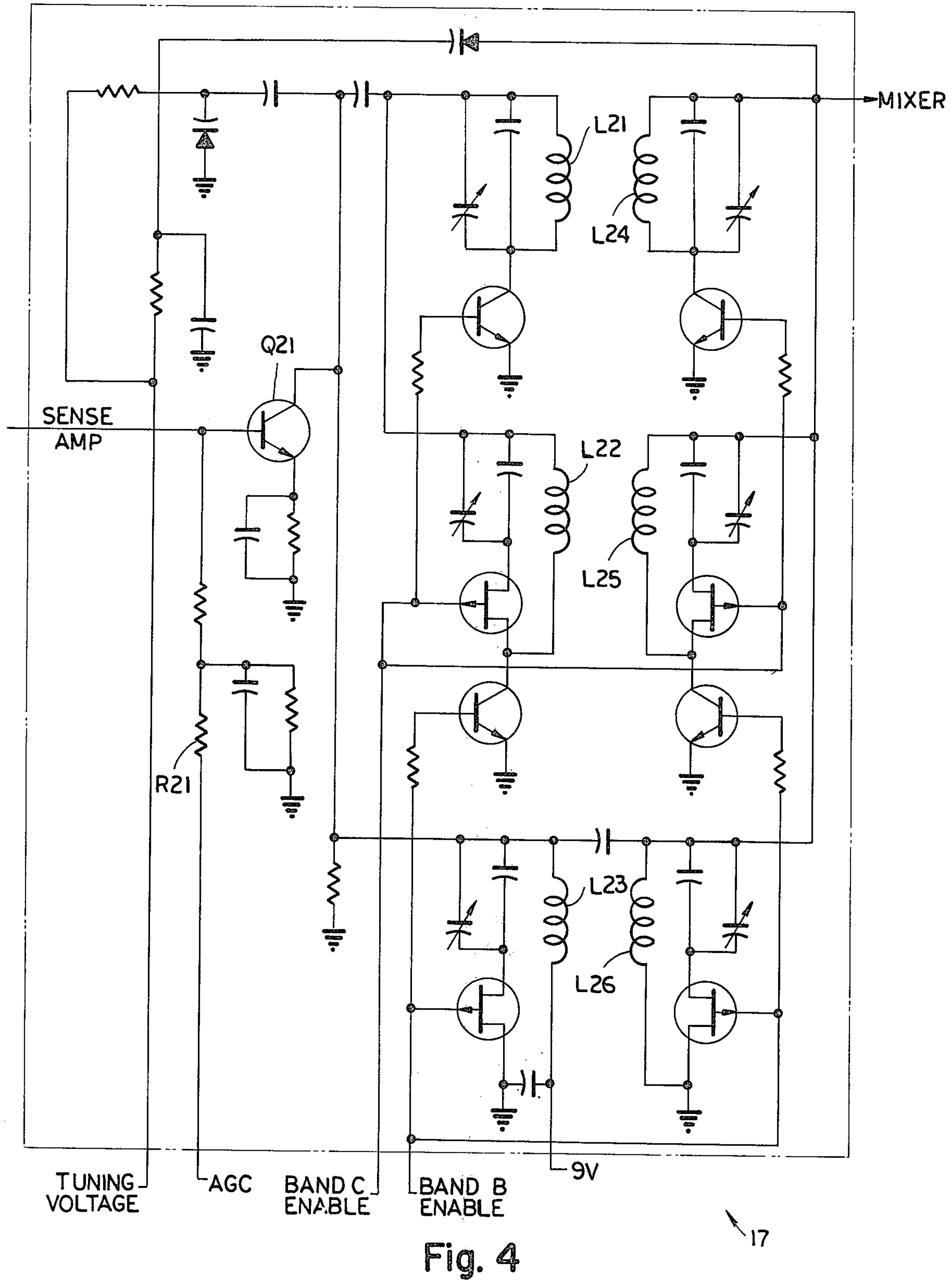
FIG. 4 is a schematic diagram of the RF amplifier of FIG. 1.

RF amplifier 17 is shown in detail in FIG. 4. RF amplifier 17 consists of a single common-emitter amplifier followed by a bandswitched double-tuned circuit. The RF amplifier, comprising Q21 and associated circuitry, amplifies the composite signal from the sense amplifier and applies it to a double-tuned stage. Receiver AGC voltage is applied to the base of Q21 by way of resistor R21. The first section of the double-tuned stage comprises L21, L22 and L23, and their associated coupling and tuning capacitors, while the second section of the double-tuned stage comprises L24, L25, and L26 and their associated coupling and tuning capacitors. The inductances and parallel tuning capacitors are switched in and out of the circuit by means of the same bandswitching techniques employed in the loop amplifier. The RF amplifier output is applied to the mixer 19 (FIG. 1).

Figure 5:
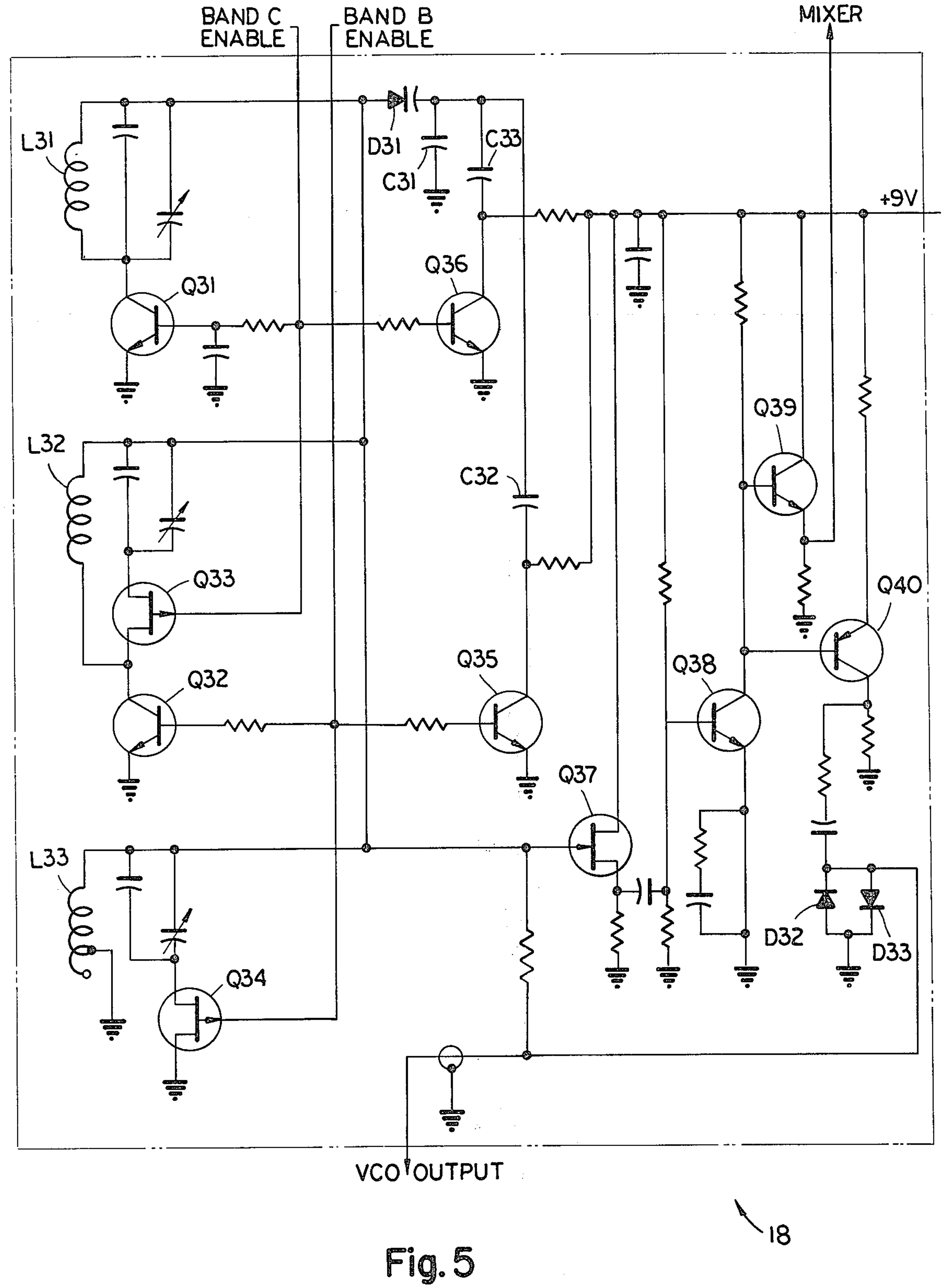
FIG. 5 is a schematic diagram of the voltage controlled oscillator of FIG. 1.

As shown in FIG. 1, the other input to mixer 19 is from voltage controlled oscillator 18, which functions as the local oscillator for the receiver. The circuitry of voltage controlled oscillator 18 is shown in FIG. 5. The voltage controlled oscillator (VCO) 18 comprises a bandswitched and track-tuned LC resonant circuit which is coupled to an amplifier with adequate feedback to sustain oscillation. The bandswitched LC circuit comprises L31, L32, L33 and their associated tuning capacitors. The bandswitching method employed in the VCO is identical to that employed in the other receiver sections, described above. Q31, Q32, Q33 and Q34 are used to perform the bandswitching. When tuning Band A (200 to 399 kilohertz), C31 is in series with the track-tuning diode D31. When Band B is selected, Q35 switches C32 into parallel with C31 to insure that D31 will tune the LC circuit over the entire band. When Band C is selected, Q36 switches C33 into parallel with C31 and C32.

Q37 functions as a source follower and matches the LC circuit into the base circuit of Q38, the amplifier. The amplifier output is applied to Q39 and Q40. Q39 functions as an emitter follower to match the VCO output into the mixer circuit of the receiver. Q40 functions as an inverter and shifts the phase of the amplifier output as required to sustain oscillation.

The inverter output is applied to a limiter circuit comprising diodes D32 and D33. The limiter output is fed back to the input of the first emitter follower and used to maintain the oscillation. The limiter output is also applied to the squaring amplifier at the point indicated "VCO output" in FIG. 5.

While there have been described above the principles of this invention in connection with specific apparatus, it is to be clearly understood that this description is made only by way of example and not as a limitation in the scope of the invention.

What is claimed is:

1. An ADF having a plurality of selectable frequency bands and having tuning means for selecting a desired band of the plurality of bands, the tuning means including a plurality of subcircuits connected in parallel, each subcircuit including a capacitor connected in parallel with an inductor, and transistor switching means, in series with certain inductors and capacitors in the plurality of subcircuits, for selectively coupling and decoupling said certain inductors and capacitors in the tuning means, said transistor switching means including:

a transistor switch in series with the capacitor of a first subcircuit of the plurality of subcircuits;

a transistor switch in series with the parallel combination of the capacitor and inductor of a second subcircuit of the plurality of subcircuits; and for each additional subcircuit, a first transistor switch in series with the capacitor and a second transistor switch in series with the parallel combination of the inductor with the capacitor and first switch.

2. The ADF of claim 1 in which the tuning means further includes local oscillator tuning means for selecting a band of a plurality of local oscillator frequency bands, the local oscillator tuning means including:

a plurality of subcircuits connected in parallel, each subcircuit including a capacitor connected in parallel with an inductor; and transistor switching means, in series with certain inductors and capacitors in the plurality of subcircuits, for selectively coupling and decoupling said certain inductors and capacitors in the tuning means.

3. The ADF of claim 1 in which the transistor switches are coupled to signals from the tuning portion of the ADF.

4. The ADF of claim 1 in which each subcircuit includes a second capacitor in parallel with the inductor, one capacitor being variable to a preset value.

5. The ADF of claim 4 in which the transistor switches are coupled to signals from the tuning portion of the ADF.

* * * * *